(12) United States Patent
Miyata et al.

(10) Patent No.: US 7,898,362 B2
(45) Date of Patent: Mar. 1, 2011

(54) PASSBAND FILTER

(75) Inventors: Yuichi Miyata, Saku (JP); Hiroyuki Morikaku, Saku (JP)

(73) Assignee: Soshin Electric Co., Ltd., Saku (JP)

( * ) Notice: Subject to any disclaimer, the term of this patent is extended or adjusted under 35 U.S.C. 154(b) by 406 days.

(21) Appl. No.: 11/814,314

(22) PCT Filed: Feb. 16, 2006

(86) PCT No.: PCT/JP2006/302775
§ 371 (c)(1),
(2), (4) Date: Jul. 19, 2007

(87) PCT Pub. No.: WO2006/088111
PCT Pub. Date: Aug. 24, 2006

(65) Prior Publication Data
US 2009/0079516 A1    Mar. 26, 2009

(30) Foreign Application Priority Data
Feb. 16, 2005    (JP) ............................... 2005-039458

(51) Int. Cl.
*H03H 7/01*    (2006.01)
(52) U.S. Cl. ..................................... 333/175
(58) Field of Classification Search .................. 333/25, 333/26, 33, 35, 125, 128, 167, 175
See application file for complete search history.

(56) References Cited

U.S. PATENT DOCUMENTS

| | | | |
|---|---|---|---|
| 6,628,189 B2 | 9/2003 | Yazaki et al. | |
| 6,693,499 B2 * | 2/2004 | Goyette et al. | 333/118 |
| 6,753,745 B2 * | 6/2004 | Killen et al. | 333/35 |
| 6,850,127 B2 * | 2/2005 | Sakakura et al. | 333/25 |
| 6,911,890 B2 | 6/2005 | Satoh et al. | |
| 6,954,116 B2 * | 10/2005 | Nosaka | 333/26 |

FOREIGN PATENT DOCUMENTS

| | | |
|---|---|---|
| EP | 1 077 528 | 2/2001 |
| JP | 58-069106 | 4/1983 |
| JP | 59-223011 | 12/1984 |
| JP | 63-76313 | 4/1988 |
| JP | 2001-60839 | 3/2001 |
| JP | 2002-374139 | 12/2002 |
| JP | 2003-7538 | 1/2003 |
| JP | 2003-037022 | 2/2003 |
| JP | 2003-060465 | 2/2003 |
| JP | 2003-115736 | 4/2003 |
| JP | 3096169 | 6/2003 |
| JP | 2004-96388 | 3/2004 |
| JP | 2007104102 A * | 4/2007 |

* cited by examiner

*Primary Examiner*—Robert Pascal
*Assistant Examiner*—Kimberly E Glenn
(74) *Attorney, Agent, or Firm*—Burr & Brown

(57) ABSTRACT

Disclosed is a filter comprising an unbalanced input terminal and two balanced output terminals (a first balanced output terminal and a second balanced output terminal. A capacitor is connected between the first balanced output terminal and the GND, another capacitor is connected between the second balanced output terminal and the GND, and a first coil is connected between the first balanced output terminal and the second balanced output terminal.

8 Claims, 6 Drawing Sheets

PASSBAND FILTER

TECHNICAL FIELD

The present invention relates to a filter for realizing an unbalanced input/balanced output type or a balanced input/ unbalanced output type without employing a balun, and more particularly to a filter suitable for use as a filter having a passband ranging from 76 to 108 MHz.

BACKGROUND OF THE INVENTION

As shown in FIG. 5, a bandpass filter 200, for example, usually has an unbalanced input terminal 202 and an unbalanced output terminal 204, providing an unbalanced input/ unbalanced output type.

If the bandpass filter 200 is to be connected to a balanced-input high-frequency amplifying circuit 206, for example, then a balun (unbalanced to balanced converter) 208 is connected between the unbalanced output terminal 204 of the bandpass filter 200 and the high-frequency amplifying circuit 206.

As shown in FIG. 6, the balun 208 has an unbalanced line 212 connected to an unbalanced input terminal 210, a first balanced line 216a connected between a first balanced output terminal 214a and ground, and a second balanced line 216b connected between a second balanced output terminal 214b and ground (see, for example, Patent Document 1). The balun 208 is constructed as a distributed-constant circuit having a plurality of striplines, each having an about λ/4 length, provided in a dielectric substrate, for example. The balun 208 is thus small in size, contributing to a size reduction of an electric device that includes the bandpass filter 200 and the balun 208.

Heretofore, there has been proposed a laminated electronic component having a base which comprises a dielectric layer and a magnetic layer that are joined to each other (see, for example, Patent Document 2). The laminated electronic component is solely aimed at preventing the product from suffering warpage, delamination, and cracking by adding a dummy layer thereto. It has been unclear, however, if the laminated electronic component can achieve an object to adapt an FM radio receiver and/or an FM transmitter in a portable device.

Patent Document 1: Japanese Laid-Open Patent Publication No. 2003-7538

Patent Document 2: Japanese Laid-Open Patent Publication No. 2003-37022

SUMMARY OF THE INVENTION

The conventional balun 208 is applied to a high passband in the vicinity of 2.4 GHz, for example. If the balun 208 is applied to a bandpass filter having a passband in a range from 76 to 108 MHz or a part of the range from 76 to 108 MHz, then the lengths of the striplines need to be increased about 24 times, and the balun 208 cannot be reduced in size.

Recently, it has been considered to adapt an FM radio receiver and/or an FM transmitter in a portable device (including an electronic device) such as a cellular phone or the like. However, since the balun 208 connected to the bandpass filter cannot be reduced in size, it is difficult to fabricate such an application.

The present invention has been made in view of the above difficulties. It is an object of the present invention to provide a filter according to an unbalanced input/balanced output type or a balanced input/unbalanced output type without employing a balun, the filter being reduced in size, and allowing an FM radio receiver and/or an FM transmitter to be adapted in a portable device, for example.

A filter according to the present invention is of the unbalanced output type having a capacitor connected between an input stage and ground, wherein the capacitor is divided into two capacitors, the two capacitors being connected between corresponding balanced input terminals and ground.

A filter according to the present invention is of the unbalanced input type having a capacitor connected between an output stage and ground, wherein the capacitor is divided into two capacitors, the two capacitors being connected between corresponding balanced output terminals and ground.

The above filters according to the present invention can realize an unbalanced input/balanced output type or a balanced input/unbalanced output type without employing a balun, and is reduced in size. In other words, a filter having a passband in a range from 76 to 108 MHz or a part of the range from 76 to 108 MHz is reduced in size. With the filter according to the present embodiment being mounted in a portable device, for example, it is possible to adapt an FM radio receiver and/or an FM transmitter in the portable device.

According to the present invention as described above, the filter may be formed in a base body comprising a dielectric member and a magnetic member that are joined to each other. It is preferable to form the two capacitors in at least the dielectric member.

Further preferably, the filter may include a ground electrode formed on a first formation surface of the dielectric member, and two capacitor electrodes for forming the two capacitors, the two capacitor electrodes being formed on a second formation surface of the dielectric member, wherein the ground electrode and the two capacitor electrodes face each other.

As described above, the filter according to the present invention is reduced in size and allows an FM radio receiver and/or an FM transmitter to be adapted in a portable device, for example.

DETAILED DESCRIPTION OF THE INVENTION

A filter according to an embodiment of the present invention as applied to a filter for use in an FM radio receiver and/or an FM transmitter, for example, will be described below with reference to FIGS. 1 through 4.

Prior to describing a filter 100 (see FIG. 2) according to the embodiment of the present invention, a filter of an unbalanced input/unbalanced output type (a filter 1 according to a comparative example) will be described for comparison below with reference to FIG. 1.

Figure 1:
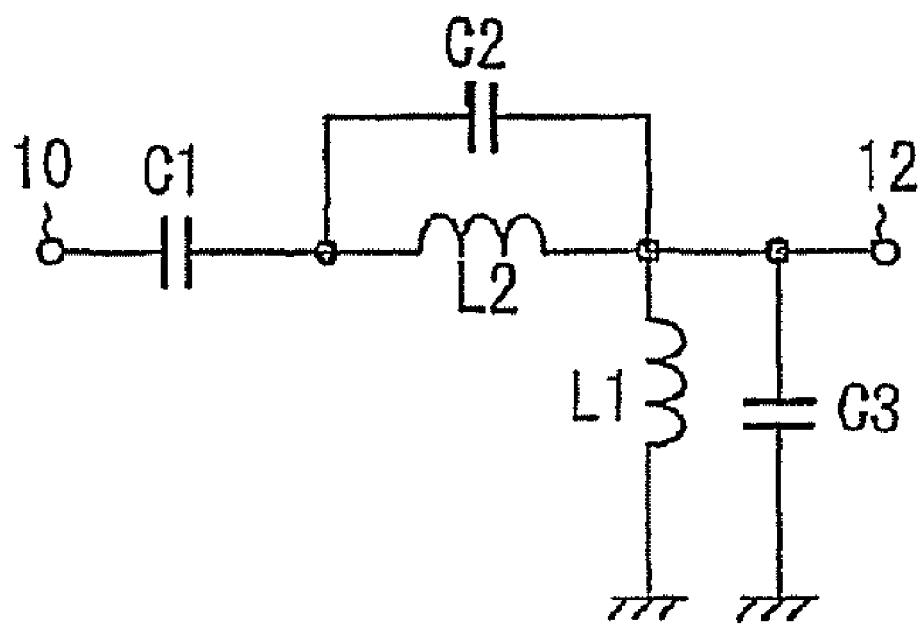
FIG. 1 is a circuit diagram of a filter according to a comparative example.

As shown in FIG. 1, the filter 1 according to the comparative example has a circuit configuration including a first capacitor C1 and a second capacitor C2 that are connected in series with each other between an unbalanced input terminal 10 and an unbalanced output terminal 12, a third capacitor C3 and a first coil L1 that are connected parallel to each other between the unbalanced output terminal 12 and GND (ground), and a second coil L2 connected across the second capacitor C2 parallel thereto. Therefore, a single capacitor (the third capacitor C3) is connected between the output stage of the filter 1 and GND.

Figure 2:
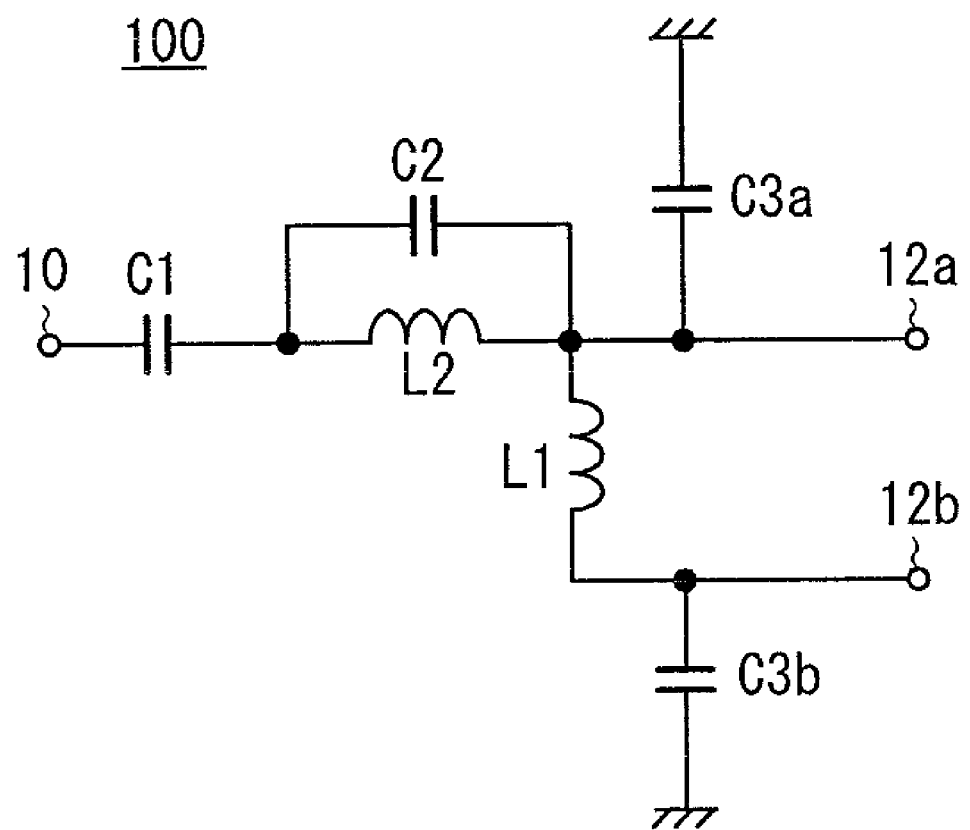
FIG. 2 is a circuit diagram of a filter according to an embodiment of the present invention.

As shown in FIG. 2, the filter 100 according to the present embodiment includes an unbalanced input terminal 10, two balanced output terminals (a first balanced output terminal 12a and a second balanced output terminal 12b), a capacitor C3a connected between the first balanced output terminal 12a and GND, a capacitor C3b connected between the second balanced output terminal 12b and GND, and a first coil L1 connected between the first balanced output terminal 12a and the second balanced output terminal 12b.

In other words, the filter 100 according to the present embodiment has a configuration wherein the third capacitor C3 of the filter 1 according to the comparative example is divided into the two capacitors C3a, C3b which are connected between the corresponding first and second balanced output terminals 12a, 12b and GND.

Specific structural details of the filter 100 according to the present embodiment will be described below with reference to FIGS. 3 and 4.

Figure 3:
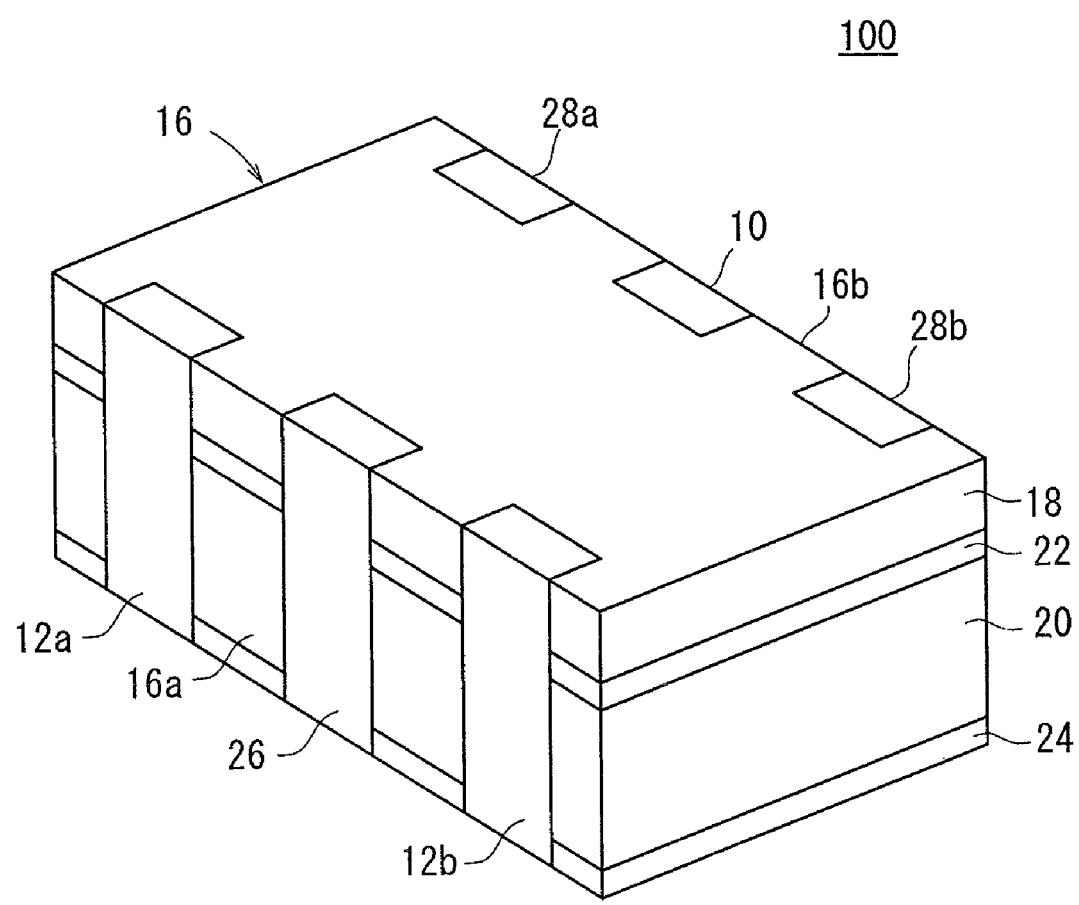
FIG. 3 is a perspective view showing an appearance of the filter according to the embodiment of the present invention.

As shown in FIG. 3, the filter 100 according to the present embodiment has a base body 16 including a dielectric member 18, a magnetic member 20, a joint member 22 joining the dielectric member 18 and the magnetic member 20 to each other, and a dummy member 24 joined to the lower end of the magnetic member 20, the members being baked into an integral assembly.

As indicated by Patent Document 2, the dummy member 24 is aimed at preventing the base body 16 from suffering warpage, delamination, and cracking.

Figure 4:
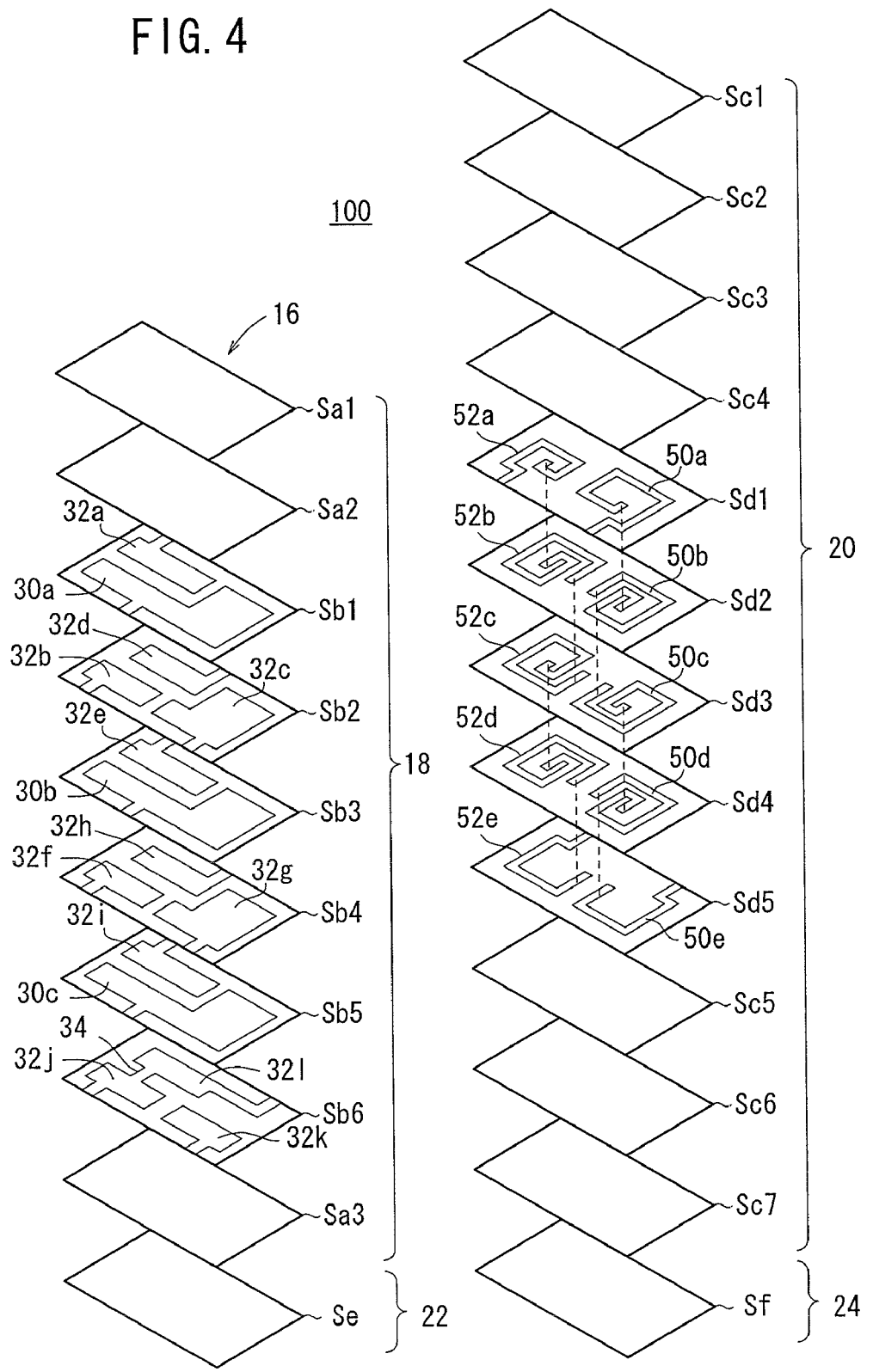
FIG. 4 is an exploded perspective view of the filter according to the embodiment of the present invention.
Figure 5:
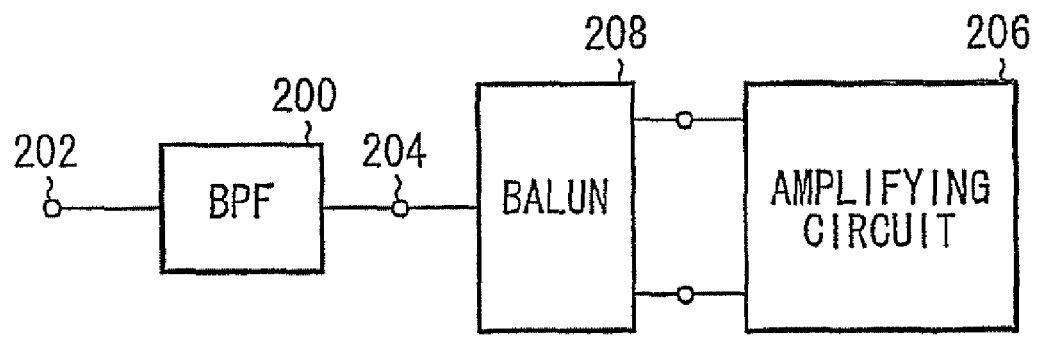
FIG. 5 is a block diagram showing an application in which a conventional bandpass filter is used.
Figure 6:
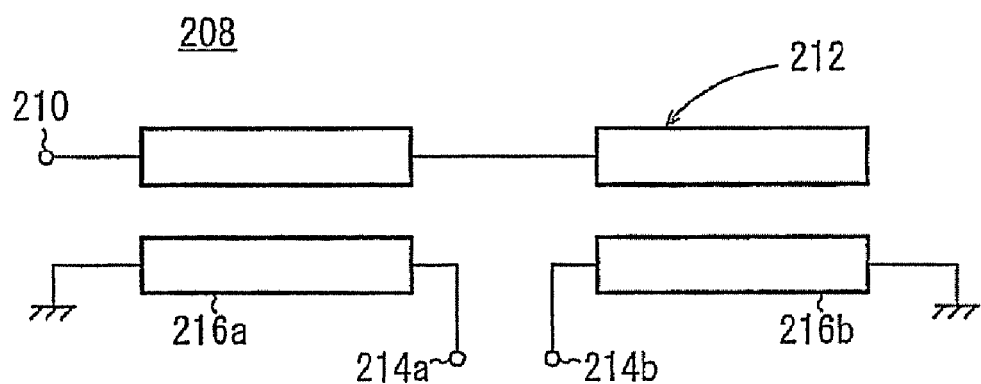
FIG. 6 is a diagram showing a balun connected to the conventional bandpass filter.

In the filter 100 according to the present embodiment, as shown in FIG. 4, the dielectric member 18 comprises a plurality of laminated dielectric layers including, successively from above, a first dummy layer Sa1, a second dummy layer Sa2, first through sixth capacitor electrode layers Sb1 through Sb6, and a third dummy layer Sa3. Each of the first dummy layer Sa1, the second dummy layer Sa2, the first through sixth capacitor electrode layers Sb1 through Sb6, and the third dummy layer Sa3 is constructed as a single layer or a plurality of layers.

The magnetic member 20 comprises a plurality of laminated magnetic layers including, successively from above, first through fourth dummy layers Sc1 through Sc4, first through fifth coil electrode layers Sd1 through Sd5, and fifth through seventh dummy layers Sc5 through Sc7. Each of the first through fourth dummy layers Sc1 through Sc4, the first through fifth coil electrode layers Sd1 through Sd5, and the fifth through seventh dummy layers Sc5 through Sc7 is constructed as a single layer or a plurality of layers.

The joint member 22 comprises a single intermediate layer Se which is constructed as a single layer or a plurality of layers.

The dummy member 24 comprises a single dummy layer Sf which is constructed as a single layer or a plurality of layers.

Each of the first through third dummy layers Sa1 through Sa3 of the dielectric member 18 and the first through seventh dummy layers Sc1 through Sc7 of the magnetic member 20 is aimed at preventing the base body 16 from suffering warpage, delamination, and cracking, as with the dummy member 24.

As shown in FIG. 3, the first balanced output terminal 12a, the second balanced output terminal 12b, and a ground terminal 26 are disposed on a first side surface 16a of the base body 16, and a first connection terminal 28a, a second connection terminal 28b, and the unbalanced input terminal 10 are disposed on a second side surface 16b (opposite to the first side surface 16a) of the base body 16.

As shown in FIG. 4, the first through sixth capacitor electrode layers Sb1 through Sb6 have various electrodes, and the first through fifth coil electrode layers Sd1 through Sd5 have various electrodes.

Specifically, the first capacitor electrode layer Sb1 has on a principal surface thereof a first ground electrode 30a having an end connected to the ground terminal 26 and a first capacitor electrode 32a having an end connected to the first connection terminal 28a.

The second capacitor electrode layer Sb2 has on a principal surface thereof a second capacitor electrode 32b having an end connected to the first balanced output terminal 12a, a third capacitor electrode 32c having an end connected to the second balanced output terminal 12b, and a fourth capacitor electrode 32d having an end connected to the unbalanced input terminal 10.

The third capacitor electrode layer Sb3 has on a principal surface thereof a second ground electrode 30b and a fifth capacitor electrode 32e which are similar respectively to the first ground electrode 30a and the first capacitor electrode 32a on the first capacitor electrode layer Sb1.

The fourth capacitor electrode layer Sb4 has on a principal surface thereof sixth through eighth capacitor electrodes 32f through 32h which are similar respectively to the second through fourth capacitor electrodes 32b through 32d on the second capacitor electrode layer Sb2.

The fifth capacitor electrode layer Sb5 has on a principal surface thereof a third ground electrode 30c and a ninth capacitor electrode 32i which are similar respectively to the first ground electrode 30a and the first capacitor electrode 32a on the first capacitor electrode layer Sb1.

The sixth capacitor electrode layer Sb6 has on a principal surface thereof a tenth capacitor electrode 32j having an end connected to the first balanced output terminal 12a, an eleventh capacitor electrode 32k having an end connected to the second balanced output terminal 12b, and a twelfth capacitor electrode 32l having an end connected to the second connection terminal 28b. The tenth capacitor electrode 32j and the twelfth capacitor electrode 32l are electrically connected to each other by a lead electrode 34.

The second capacitor electrode 32b and the third capacitor electrode 32c face the first ground electrode 30a and the second ground electrode 30b, respectively. The sixth capacitor electrode 32f and the seventh capacitor electrode 32g face the second ground electrode 30b and the third ground electrode 30c, respectively. The tenth capacitor electrode 32j and the eleventh capacitor electrode 32k face the third ground electrode 30c.

The fourth capacitor electrode 32d faces the first capacitor electrode 32a and the fifth capacitor electrode 32e. The eighth capacitor electrode 32h faces the fifth capacitor electrode 32e and the ninth capacitor electrode 32i. The twelfth capacitor electrode 32l faces the ninth capacitor electrode 32i.

The first through fifth coil electrode layers Sd1 through Sd5 have on respective principal surfaces thereof respective first through fifth coil electrodes 50a through 50e which make up the first coil L1 and respective sixth through tenth coil electrodes 52a through 52e which make up the second coil L2. The first coil electrode 50a on the principal surface of the first coil electrode layer Sd1 has an end connected to the second balanced output terminal 12b, and the sixth coil electrode 52a has an end connected to the first balanced output terminal 12a. The fifth coil electrode 50e on the principal surface of the fifth coil electrode layer Sd5 has an end connected to the second connection terminal 28b, and the tenth coil electrode 52e has an end connected to the first connection terminal 28a. The first through fifth coil electrodes 50a through 50e are electrically connected to each other by via holes, and the sixth through tenth coil electrodes 52a through 52e are electrically connected to each other by via holes.

With the above configuration, the first ground electrode 30a, the second capacitor electrode 32b, the second ground electrode 30b, the sixth capacitor electrode 32f, the third ground electrode 30c, and the tenth capacitor electrode 32j make up a laminated structure providing the capacitor C3a shown in FIG. 2. The first ground electrode 30a, the third capacitor electrode 32c, the second ground electrode 30b, the seventh capacitor electrode 32g, the third ground electrode 30c, and the eleventh capacitor electrode 32k make up a laminated structure providing the capacitor C3b shown in FIG. 2.

Similarly, the first capacitor electrode 32a, the fourth capacitor electrode 32d, the fifth capacitor electrode 32e, the eighth capacitor electrode 32h, and the ninth capacitor electrode 32i make up a laminated structure providing the first capacitor C1. The ninth capacitor electrode 32i and the twelfth capacitor electrode 32l make up a laminated structure providing the second capacitor C2.

The first through fifth coil electrodes 50a through 50e make up the first coil L1 shown in FIG. 2, and the sixth through tenth coil electrodes 52a through 52e make up the second coil L2.

Since the filter 100 according to the present embodiment has a configuration wherein the third capacitor C3 in the output stage of the filter 1 according to the comparative example is divided into the two capacitors C3a, C3b which are connected between the corresponding first and second balanced output terminals 12a, 12b and GND, the filter 100 can realize an unbalanced input/balanced output type or a balanced input/unbalanced output type without employing a balun, and is reduced in size. In other words, the filter 100 having a passband in a range from 76 to 108 MHz or a part of the range from 76 to 108 MHz is reduced in size. With the filter 100 according to the present embodiment being mounted in a portable device, for example, it is possible to adapt an FM radio receiver and/or an FM transmitter in the portable device.

According to the present embodiment, inasmuch as the filter 100 is formed in the base body 16 comprising the dielectric member 18 and the magnetic member 20 that are joined to each other, the capacitors C1, C2, C3a, C3b can be formed in the dielectric member 18 whose dielectric constant is high, and the coils L1, L2 can be formed in the magnetic member 20 whose magnetic permeability is high. This configuration further contributes to a size reduction of the filter 100.

According to the present embodiment, furthermore, the first ground electrode 30a is disposed on the first capacitor electrode layer Sb1 of the dielectric member 18, and the second capacitor electrode 32b and the third capacitor electrode 32c are disposed on the second capacitor electrode layer Sb2, with the second capacitor electrode 32b and the third capacitor electrode 32c facing the first ground electrode 30a.

Consequently, the third capacitor C3 in the output stage of the filter 1 according to the comparative example can easily be divided into the two capacitors C3a, C3b, and according to the present embodiment, the filter 100 can realize an unbalanced input/balanced output type or a balanced input/unbalanced output type without employing a balun, and is reduced in size. The filter 100 can be fabricated easily and inexpensively.

If it is assumed that the above combination (the first ground electrode 30a, the second capacitor electrode 32b, and the third capacitor electrode 32c) is used as a single array pattern, then according to the present embodiment, as shown in FIG. 4, three such array patterns are juxtaposed in the laminated directions of the dielectric layers of the dielectric member 18. Therefore, the capacitance of each of the capacitors C3a, C3b is increased for a further reduction in the size of the filter 100. This also holds true for the relationship between the first capacitor electrode 32a on the first capacitor electrode layer Sa1 and the fourth capacitor electrode 32d on the second capacitor electrode layer Sa2. By laminating above array patterns, the capacitance of the first capacitor C1 is also increased. One array pattern, two array patterns, or four or more array patterns can be laminated.

The capacitance of each of the capacitors C3a, C3b may be adjusted to achieve a match between a signal output from the first balanced output terminal 12a and a signal output from the second balanced output terminal 12b. In this case, the capacitance of each of the capacitors C3a, C3b can be adjusted by appropriately changing the areas of the second capacitor electrode 32b, the third capacitor electrode 32c, the sixth capacitor electrode 32f, the seventh capacitor electrode 32g, the tenth capacitor electrode 32j, and the eleventh capacitor electrode 32k, or appropriately changing the dielectric constants and/or thicknesses of the dielectric layers between these capacitor electrodes.

In the above embodiment, the present invention is applied to an unbalanced-input/balanced-output filter. The present invention is also applicable to a balanced-input/unbalanced-output filter. In such a case, the unbalanced input terminal 10 may be used as an unbalanced output terminal, the first balanced output terminal 12a as a first balanced input terminal, and the second balanced output terminal 12b as a second balanced input terminal.

The filter according to the present invention is not limited to the above embodiment, but may take various configurations without departing from the scope of the invention.

The invention claimed is:

1. A filter of an unbalanced output type having a capacitor connected between an input stage and ground, wherein
said capacitor is divided into two capacitors, said two capacitors being connected between corresponding balanced input terminals and ground,
said filter is formed in a base body comprising a dielectric member and a magnetic member that are joined to each other, and
wherein at least an unbalanced output terminal is formed on a surface of said base body, said balanced input terminals comprise a first balanced input terminal and a second balanced input terminal formed on said surface of said base body, and at least a ground terminal is formed on said surface of said base body;
a plurality of capacitor electrodes and a plurality of coil electrodes are formed in said base body;
a first capacitor, a second capacitor, a third capacitor, and a fourth capacitor are formed from said plurality of capacitor electrodes, said two capacitors comprising said third and fourth capacitors, said first capacitor and said second capacitor being connected in series with each other between said unbalanced output terminal and said first balanced input terminal, said third capacitor being connected between said first balanced input terminal and said ground terminal, and said fourth capacitor being connected between said second balanced input terminal and said ground terminal; and a first coil and a second coil are formed from said plurality of coil electrodes, said first coil being connected between said first balanced input terminal and said second balanced input terminal, and said second coil being connected in parallel with said second capacitor.

2. A filter according to claim 1, wherein said two capacitors are formed in at least said dielectric member.

3. A filter according to claim 2, including:

a ground electrode formed on a first formation surface of said dielectric member; and two capacitor electrodes of said plurality of capacitor electrodes for forming said two capacitors, said two capacitor electrodes being formed on a second formation surface of said dielectric member;

wherein said ground electrode and said two capacitor electrodes face each other.

4. A filter according to claim 1, which has a passband in a range from 76 to 108 MHz or a part of the range from 76 to 108 MHz.

5. A filter of an unbalanced input type having a capacitor connected between an output stage and ground, wherein said capacitor is divided into two capacitors, said two capacitors being connected between corresponding balanced output terminals and ground, and said filter is formed in a base body comprising a dielectric member and a magnetic member that are joined to each other, and wherein at least an unbalanced input terminal is formed on a surface of said base body, said balanced output terminals comprise a first balanced output terminal and a second balanced output terminal formed on said surface of said base body, and at least a ground terminal is formed on said surface of said base body;

a plurality of capacitor electrodes and a plurality of coil electrodes are formed in said base body;

a first capacitor, a second capacitor, a third capacitor, and a fourth capacitor are formed from said plurality of capacitor electrodes, said two capacitors comprising said third and fourth capacitors, said first capacitor and said second capacitor being connected in series with each other between said unbalanced input terminal and said first balanced output terminal, said third capacitor being connected between said first balanced output terminal and said ground terminal, and said fourth capacitor being connected between said second balanced output terminal and said ground terminal; and a first coil and a second coil are formed from said plurality of coil electrodes, said first coil being connected between said first balanced output terminal and said second balanced output terminal, and said second coil being connected in parallel with said second capacitor.

6. A filter according to claim 5, wherein said two capacitors are formed in at least said dielectric member.

7. A filter according to claim 6, including:

a ground electrode formed on a first formation surface of said dielectric member; and two capacitor electrodes of said plurality of capacitor electrodes for forming said two capacitors, said two capacitor electrodes being formed on a second formation surface of said dielectric member;

wherein said ground electrode and said two capacitor electrodes face each other.

8. A filter according to claim 5, which has a passband in a range from 76 to 108 MHz or a part of the range from 76 to 108 MHz.

* * * * *